United States Patent [19]

Ishiguro et al.

[11] Patent Number: 4,990,872
[45] Date of Patent: Feb. 5, 1991

[54] VARIABLE REACTANCE CIRCUIT PRODUCING NEGATIVE TO POSITIVE VARYING REACTANCE

[75] Inventors: Kazuhisa Ishiguro; Mikio Yamagishi, both of Gunma, Japan

[73] Assignee: Sanyo Electric Co., Ltd., Osaka, Japan

[21] Appl. No.: 206,272

[22] Filed: Jun. 13, 1988

[30] Foreign Application Priority Data

Jun. 17, 1987 [JP] Japan .................................. 62-150606
Jun. 17, 1987 [JP] Japan .................................. 62-150607

[51] Int. Cl.$^5$ ........................................... H03H 11/48
[52] U.S. Cl. ..................................... 333/213; 333/214; 333/216; 330/257
[58] Field of Search ............................... 333/213-217; 307/358-360, 490, 494; 330/257

[56] References Cited

U.S. PATENT DOCUMENTS 3,986,145  10/1976  Hongu et al. ................. 333/214 X
4,587,500   5/1986  Tanaka et al. ................. 333/214 X
4,638,265   1/1987  Lunn et al. ........................ 333/214

FOREIGN PATENT DOCUMENTS 64-421    5/1980  Japan .................................. 333/213
229417  11/1985  Japan .................................. 333/215

Primary Examiner—Benny Lee
Attorney, Agent, or Firm—Darby & Darby

[57] ABSTRACT

A reactance circuit comprises a differential amplification circuit formed by differentially connecting the first and second transistors to each other, a load connected to a collector of the first transistor, a reactance element interposed between a base of the first transistor and a reference potential point, and a capacitor and a resistor connected in series between the collector and the base of the first transistor. A negative feedback loop to the first transistor is formed by the capacitor and the resistor. Accordingly, when the collector of the first transistor is used as an output terminal, a negative equivalent reactance is produced in the output terminal.

8 Claims, 3 Drawing Sheets

FIG. 5
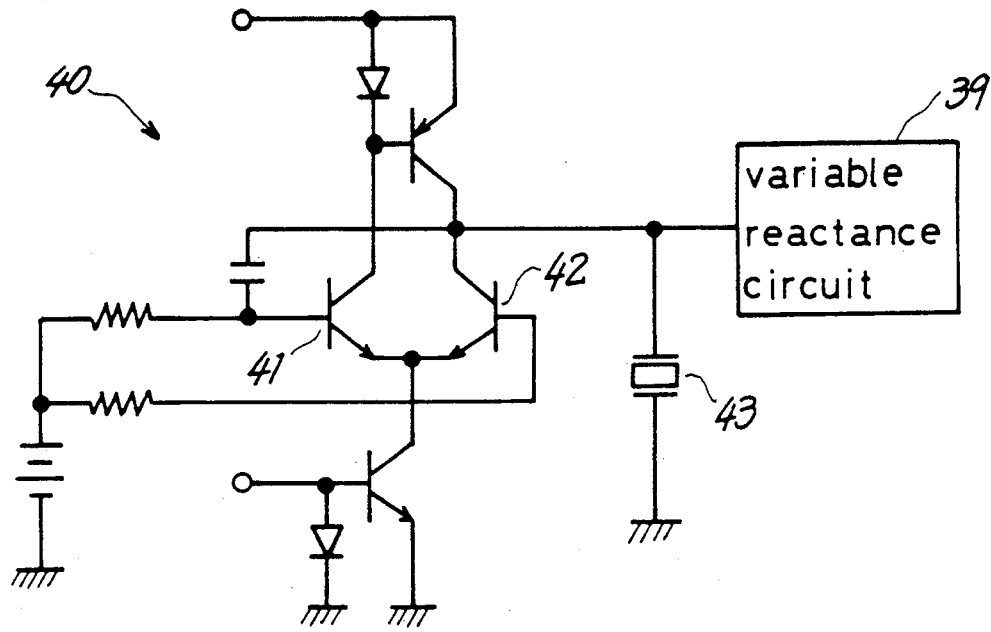
FIG. 6
FIG. 7 PRIOR ART
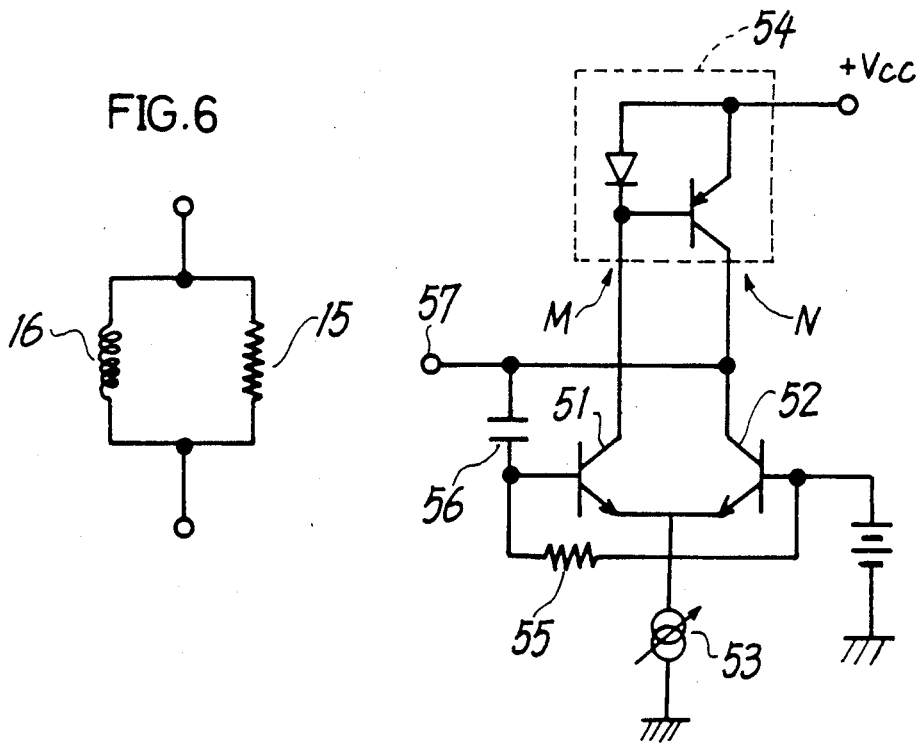

VARIABLE REACTANCE CIRCUIT PRODUCING NEGATIVE TO POSITIVE VARYING REACTANCE

FIELD OF THE INVENTION

This invention relates to a reactance circuit to be built in a variety of electronic equipments, and particularly to a reactance circuit having no likelihood that oscillation occurs.

BACKGROUND OF THE INVENTION

Applicant has already proposed a variable reactance circuit which can be built into semiconductor integrated circuits (U.S. Pat. No. 4,587,500). There is shown in FIG. 7 an equivalent reactance circuit which is used for producing a negative reactance in the variable reactance circuit as disclosed in this U.S. Patent.

The equivalent reactance circuit comprises a first and second transistors 51 and 52 having emitters thereof connected in common, a variable current source 53 connected to the common emitter of the first and second transistors, a current mirror circuit 54 connected to the collectors of the first and second transistors, a resistor 55 connected between the bases of the first transistor 51 and the second transistor 52, and a capacitor 56 connected between the collector of the second transistor 52 and the base of the first transistor 51. The reactance circuit, as viewed from the output terminal 57 connected to the collector of the second transistor 52, operates as a negative equivalent reactance. Reactance X of the reactance circuit is expressed as follows:

$$X \approx -2 \omega\, gmRC \qquad (1)$$

wherein $\omega$ is an angular frequency, gm is a mutual conductance of differential amplification circuit comprising the first and second transistors, R is a value of resistance of the resistor 55, and C is a capacitance of the capacitor 56. Also, the mutual conductance gm of the differential amplification circuit described above is expressed as follows:

$$gm = \frac{\alpha \cdot q \cdot I}{4KT} = \frac{\alpha}{104} \cdot I \qquad (2)$$

wherein T is an absolute temperature, q is an electric charge amount of electron, K is Boltzmann's constant, $\alpha$ is a current amplification rate, and I is a current flowing into the variable current source 53.

Accordingly, the circuit shown in FIG. 7, as apparent from the equations (1) and (2), provides the variable reactance circuit having the negative capacitive reactance X which varies by changing the current value I of the variable current source 53. This reactance circuit can be easily formed on the IC and is thus advantageous.

However, there was such a likelihood that some oscillation might be occurred in the reactance circuit of FIG. 7 due to a reason that the circuit comprises a positive feedback loop returning to the base of the first transistor 51 by way of the collector of the first transistor, the current mirror circuit 54 and the capacitor 56, which will be described in below.

In particular, for acquisition of a large negative reactance, when the variable current source 53 is so adjusted to flow therein a large electric current to increase a gain of the differential amplification circuit composed of the first and second transistors 51, 52, and further when, for instance, the base voltage of the first transistor 51 is increased in accordance with signals connected to the output terminal 57, the collector current of the first transistor 51 will be increased, and the current at the input side (point M) of the current mirror circuit 54 will be increased. As a result, the current mirror circuit 54 permits current flow equivalent to that of the input side into the output side (point N). On the other hand, with increased base voltage of the first transistor 51, the collector current of the second transistor 52 will be decreased. The increase of the current at the output side of the current mirror circuit 54 and the decrease of the collector current of the second transistor 52 result in the voltage generated is at a high level at the output terminal 57, and this voltage is positively fed back to the base of the first transistor 51 through the capacitor 56. The formation of positive feedback loop becomes a cause of oscillations.

Although the U.S. Pat. No. 4,587,500 as referred in the above discloses the reactance circuit having a negative feedback loop, it produces only a positive reactance but fails to produce as a negative reactance.

SUMMARY OF THE INVENTION

An object of the present invention is to provide a reactance circuit wherein any oscillation or spurious resonance never occurs.

Another object of the present invention is to provide a reactance circuit wherein only a negative feed back loop is formed without forming a positive feed back loop and furthermore a negative reactance can be produced.

A further object of the present invention is to provide a reactance circuit which can vary the reactance throughout a wide range from a negative value to a positive value by providing a first variable reactance circuit having a negative reactance and a second variable reactance circuit having a positive reactance.

In the reactance circuit according to the present invention, a differential amplification circuit is formed by differentially connecting the first and second transistors to each other, a load is connected to a collector of the first transistor, a reactance element is interposed between the base of the first transistor and the reference potential point, and a capacitor and a resistor are connected in series between the collector and the base of the first transistor, thus forming a negative feedback loop to the first transistor by the capacitor and the resistor. Accordingly, when the collector of the first transistor is used as an output terminal, a negative equivalent reactance is produced in the output terminal. The negative equivalent reactance is determined by characteristic of the differential amplification circuit, the value of reactance element, the value of resistance and so on.

The reactance circuit according to the present invention is not formed with a positive feed back loop and therefore any oscillation or spurious resonance will never occur.

BRIEF DESCRIPTION OF THE DRAWINGS

FIG. 5 is a bock diagram of an oscillation circuit having a variable reactance circuit;

FIG. 6 is an equivalent circuit diagram of the reactance circuit according to the present invention; and FIG. 7 is a block diagram of a conventionally used variable reactance circuit;

DETAILED DESCRIPTION OF THE INVENTION

Figure 1:
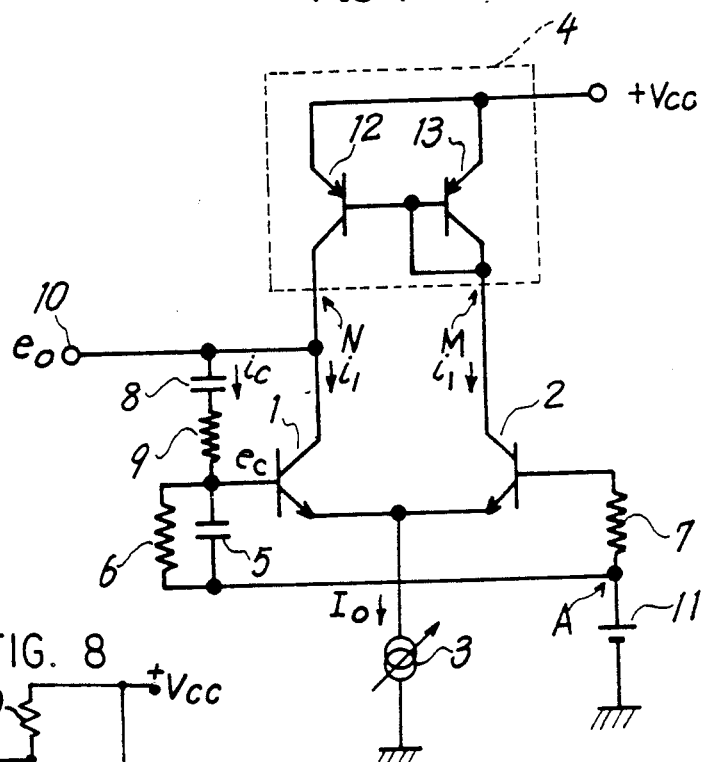
FIG. 1 is a block diagram of a variable reactance circuit having a capacitor as a reactance element.

In the reactance circuit according to the present invention, as shown in FIG. 1, the first transistor 1 and the second transistor 2 are differentially connected to each other to form a differential amplification circuit, wherein the first transistor 1 has a collector connected to the load such as current mirror circuit 4 or resistor or the like. The reactance element such as capacitor 5, coil 14, etc. is interposed between the base of the first transistor 1 and the reference potential point A, and further the capacitor 8 and the resistor 9 are connected in series between the collector of the first transistor 1 and the reactance element.

The reactance circuit according to the present invention will be described with reference to the embodiments as illustrated in FIGS. 1 to 4.

Figure 2:
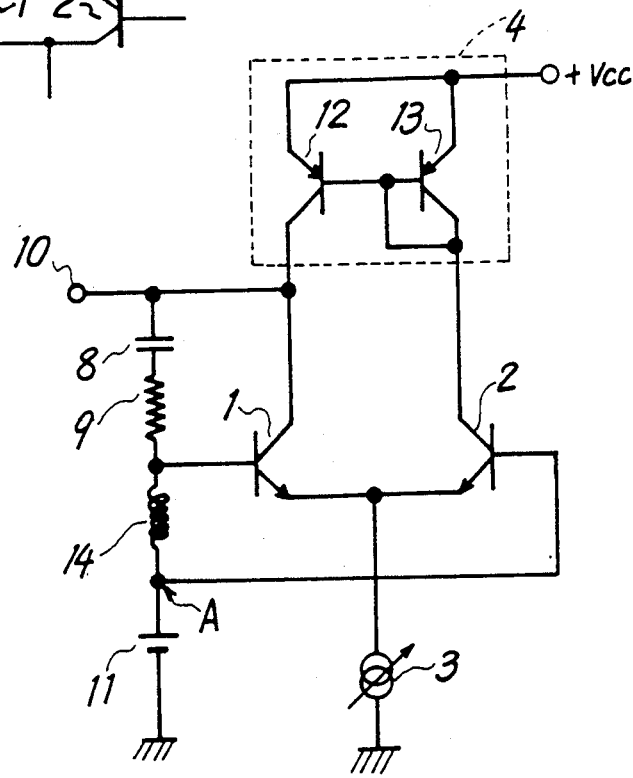
FIG. 2 is a block diagram of a variable reactance circuit having a coil as a reactance element.
Figure 3:
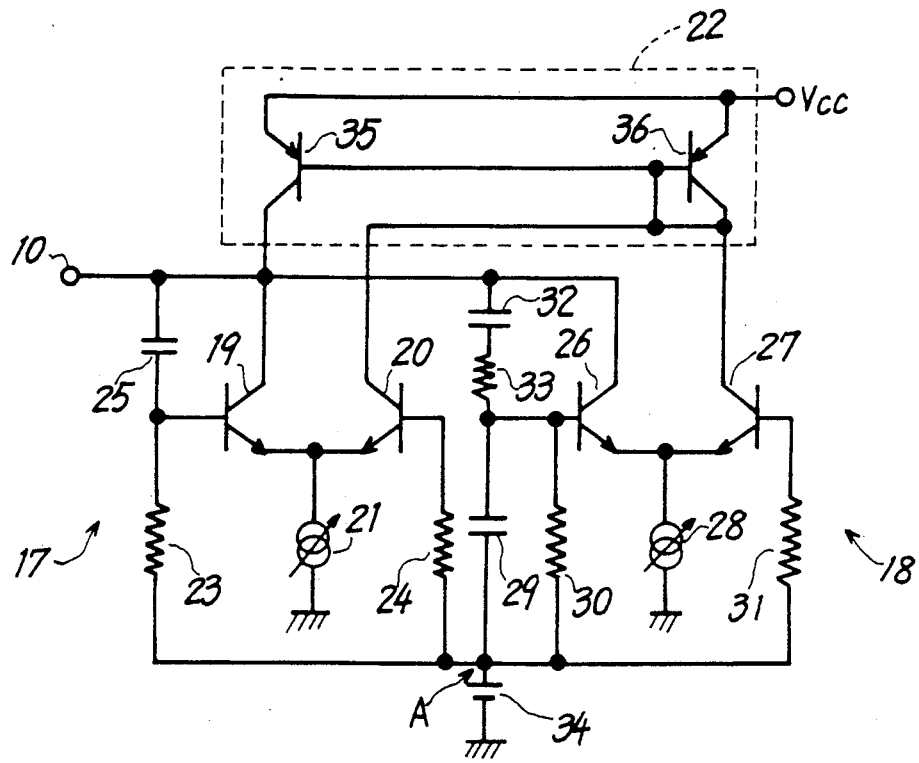
FIG. 3 is a block diagram of a variable reactance circuit which has a capacitor as a reactance element and can vary the equivalent reactance from a negative value to a positive value.
Figure 4:
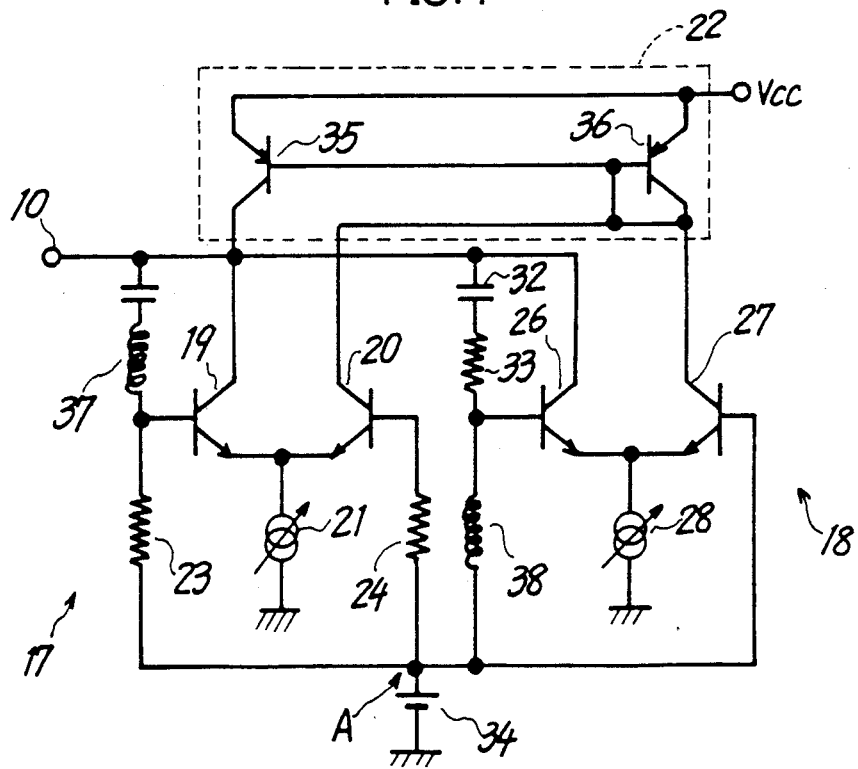
FIG. 4 is a block diagram of a variable reactance circuit which has a coil as a reactance element and can vary the reactance from a negative value to a positive value.

FIGS. 1 and 2 show the embodiments relating to the variable reactance circuits for producing the negative equivalent capacitive reactance and the negative equivalent inductive reactance, respectively. FIGS. 3 and 4 show the embodiments relating to the variable reactance circuit for producing the negative equivalent reactance and the positive equivalent reactance.

FIRST EMBODIMENT

As shown in FIG. 1, the differential amplification circuit is formed by connecting in common with the emitter of the first transistor 1 and the emitter of the second transistor 2 and further by connecting the common emitter to the variable current source 3. The collectors of both transistors 1, 2 are connected to an input point M and an output point N of the current mirror circuit 4, respectively. The power source $V_{cc}$ is connected to the current mirror circuit 4.

The first capacitor 5 and the first resistor 6 are connected in parallel between the base of the first transistor 1 and the reference potential point A as an output point of D.C. voltage source 11. The second resistor 7 is connected between the base of the second transistor 2 and the reference potential point A. Further, the second capacitor 8 and the third resistor 9 are connected in series between the base and the collector of the first transistor 1. Also, the output terminal 10 is associated with the connecting point between the second capacitor 8 and the collector of the first transistor 1.

The current mirror circuit 4 is formed by connecting the base of the fourth transistor 12 and the base of the fifth transistor 13 to each other and further by short-circuiting the base and the connector of the fifth transistor 13, thus operating for flowing the equivalent amount of current into both the output point N connected to the collector of the fourth transistor 12 and the input point M connected to the collector of the fifth transistor 13.

The above-described reactance circuit operates as the negative equivalent reactance, as viewed from the output terminal 10, which will be described later.

When the current $I_0$ flows into the variable current source 3 so as to bring the reactance circuit of FIG. 1 into operating condition and the signal having a voltage $e_0$ is applied to the output terminal 10, the current $i_c$ flowing into the second capacitor 8 is expressed as follows:

$$i_c = \frac{e_0}{Z_1 + Z_2} \quad (3)$$

wherein $Z_1$ is a resultant impedance of the second capacitor 8 and the third resistor 9, and $Z_2$ is a resultant impedance of the first capacitor 5 and the first resistor 6.

The resultant impedances $Z_1$ and $Z_2$ are expressed respectively, as follows:

$$Z_1 = R_a + 1/j\omega C_1 \quad (4)$$

$$Z_2 = \frac{1}{1/R_1 + j\omega C_a} \quad (5)$$

wherein $R_a$ is a value of resistance of the third resistor 9, $C_1$ is a value of capacitance of the second capacitor 8, $R_1$ is a resistance value of the first resistor 6, $C_a$ is a value of capacitance of the first capacitor 5 and $\omega$ is an angular frequency.

Also, the base voltage $e_c$ of the first transistor 1 is expressed as follows:

$$e_c = i_c Z_2 \quad (6)$$

On the other hand, the collector current $i_1$ of the first transistor 1 is expressed as follows:

$$i_1 = gm \cdot e_c \quad (7)$$

wherein gm is a mutual conductance of the differential amplification circuit comprising the first and second transistors.

By putting the equation (6) into the place of $e_c$ of the equation (7), the collector current $i_1$ is given as follows:

$$i_1 = gm \cdot i_c \cdot Z_2 \quad (8)$$

Therefore, the current i flowing through the output terminal 10 when the signal $e_0$ is applied to the output terminal 10, is expressed as follows:

$$i = 2i_1 + i_c \quad (9)$$

By putting the equations (3) and (8) into the equation (9), the relationship as indicated in the following equation is obtained:

$$i = \left( \frac{2gm}{1/R_1 + j\omega C_a} + 1 \right) \times \frac{e_0}{R_a + 1/j\omega C_1 + \{1/(1/R_1 + j\omega C_a)\}} \quad (10)$$

When taking it into consideration the condition such as $R_a \gg 1/\omega C_1$ and $R_1 \gg 1/\omega C_a$, the equation (10) can be transformed as follows:

$$i \approx \left(1 + \frac{2gm}{j\omega C_a}\right)\frac{e_0}{R_a + 1/j\omega C_a} \quad (11)$$

Further, when taking the condition of $R_a \gg 1/\omega C_a$ into consideration, the equation (11) is transformed as follows:

$$i = \left(\frac{1}{R_a} + \frac{2gm}{j\omega C_a R_a}\right) \cdot e_0 \quad (12)$$

When the reactance circuit of FIG. 1 is seen from the output terminal 10, the equation (12) means that the reactance circuit is equivalently converted into a parallel circuit comprising a resistor 15 having the resistance value $R_a$ and a coil 16 having the inductive reactance $\omega C_a R_a/2$ gm, as shown in FIG. 6.

Furthermore, by putting the relationship $gm = \alpha I_0/104$ corresponding to the equation (2) into the place of "gm" of the foregoing inductive reactance ($\omega C_a R_a/2$ gm), the inductive reactance X is expressed as follows:

$$X = \omega C_a R_a (52/\alpha I_0) \quad (13)$$

The equation (13) means that the circuit of FIG. 1 operates as the negative variable reactance circuit wherein the reactance is variable by changing the current $I_0$ of the variable current source 3.

Meanwhile, with reference to the reactance circuit of FIG. 1, there is not formed positive feedback loop unlike the conventional one, but is formed two negative feedback loops which contributes to the stable operation in the circuit. The first negative feedback loop is a loop which returns to the base of the first transistor 1 by way of the collector of the first transistor, the second capacitor 8 and the third resistor 9. The second negative feed back loop is a loop which returns to the base of the first transistor 1 by way of the emitter of the first transistor 1, the second transistor 2, the current mirror circuit 4, the second capacitor 8 and the third resistor 9.

When the current flowing into the variable current source 3 is increased so as to obtain a large negative reactance, and further when, for instance, the base voltage of the first transistor 1 is increased in accordance with signals connected to the output terminal 10, the collector current and the emitter current of the first transistor 1 will be increased. Therefore, the correspondingly enlarged amount of electric current flows into the collector of the first transistor 1 from the output terminal 10, resulting in that the voltage drops at the output terminal 10. This voltage drop is negatively fed back to the base of the first transistor 1 by way of the second capacitor 8 and the third resistor 9, thus forming the first negative feedback loop.

Since the emitter current and the collector current of the second transistor 2 decrease by the amount increased in the emitter current of the transistor 1 the current flowing through the output point (point N) of the current mirror circuit 4 will be decreased. The current including an incremental amount corresponding to the said decreased amount flows into the collector of the first transistor 1 from the output terminal 10, resulting in that the voltage drops at the output terminal 10. This voltage drop is negatively fed back to the base of the first transistor 1 by way of the second capacitor 8 and the third resistor 9, thus forming the second negative feedback loop.

Therefore, the reactance circuit shown in FIG. 1 produces the negative reactance without forming the positive feedback loop between the base and the collector of the first transistor 1. Even if the current of the variable current source 3 is increased, the stable operation can be realized without the occurrence of oscillation, accordingly.

SECOND EMBODIMENT

In this embodiment, the coil 14 is used as a reactance element in substitution for the first capacitor 5 described in the first embodiment, as shown in FIG. 2. It will be apparent that the reactance circuit operates in the same manner as that of FIG. 1 and can produce the negative feedback loop. In this case, the positive equivalent capacitive reactance is produced at the output terminal 10.

THIRD EMBODIMENT

With reference to FIG. 3, the reactance circuit comprises a first variable reactance circuit 17 operating as a positive equivalent reactance and a second variable reactance circuit 18 operating as a negative equivalent reactance. The second variable reactance circuit 18 has the same structure as that of FIG. 1.

In the first variable reactance circuit 17, the emitter of the first transistor 19 and the emitter of the second transistor 20 are connected in common with the first variable current source 21, and the collectors of both transistors 19, 20 are connected to the current mirror circuit 22.

The first resistor 23 is connected between the base of the first transistor 19 and the reference potential point A as the output point of the D.C. voltage source 34. The second resistor 24 is connected between the base of the second transistor 20 and the reference potential point A. Also, a first capacitor 25 is connected between the base and the collector of the first transistor 19. The output terminal 10 is associated with the connection of the first capacitor 25 and the collector of the first transistor 19.

In the second variable reactance circuit 18, the emitter of the third transistor 26 and the emitter of the fourth transistor 27 are connected in common with the second variable current source 28, and the collectors of both transistors 26, 27 are connected to the current mirror circuit 22.

The second capacitor 29 and the second resistor 30 are connected in parallel between the base of the third transistor 26 and the aforesaid reference potential point A. The third resistor 31 is connected between the base of the fourth transistor 27 and the aforesaid reference potential point A. Also, the third capacitor 32 and the fourth resistor 33 are connected in series between the collector and the base of the third transistor 26.

The current mirror circuit 22 comprises the fifth transistor 35 and the sixth transistor 36, as already described in the above.

The first variable reactance circuit 17, as viewed from the output terminal, operates as a positive equivalent reactance, while the second variable reactance circuit 18, as viewed from the output terminal, operates as a negative equivalent reactance.

To obtain the positive reactance in the reactance circuit shown in FIG. 3, the first variable current source 21 is brought into operating condition to allow the current $I_0$ flow therein and the second variable current source 28 is brought into non-operating condition.

In this case, the reactance X of the reactance circuit can be given as follows, as well as the foregoing equation (1)

$$X \approx 2\omega gm_1 R_1 C_1 \quad (14)$$

wherein $gm_1$ is a mutual conductance of the differential amplification circuit comprising a first and second transistors 19 and 20, $R_1$ is a resistance value of the first resistor 23 and $C_1$ is a capacitance value of the first capacitor 25. Also, the mutual conductance $gm_1$ is given as follows, as well as the foregoing equation (2):

$$gm_1 = \frac{a}{104} \cdot I_0 \quad (15)$$

Accordingly, the first reactance circuit 17 operates as an equivalent reactance which is variable from zero to a positive given value in accordance with the electric current value $I_0$ of the first variable current source 21.

To obtain the negative reactance, the first variable current source 21 is brought into non-operating condition and the second variable current source 28 is brought into operating condition to allow the current $I_0$ flow therein.

In this case, the following relationship is obtained in a same manner as that of the reactance circuit of FIG. 1.

$$i \approx \left( \frac{1}{R_a} + \frac{2gm}{j\omega C_a R_a} \right) \cdot e_0 \quad (16)$$

$$X = \omega C_a R_a (52/\alpha I_0) \quad (17)$$

wherein i is an electric current flowing into the output terminal 10, $R_a$ is a resistance value of the fourth resistor 33, $C_a$ is a capacitance value of the second capacitor 29, and gm is a mutual conductance of the differential amplification circuit comprising the third transistor 26 and the fourth transistor 27.

When the second reactance circuit 18 is seen from the output terminal 10, the aforesaid equation (16) means that the reactance circuit 18 is equivalently converted to the parallel circuit comprising the resistor 15 having a resistance $R_a$ and the coil 16 having an inductive reactance $\omega C_a R_a/2$ gm, as shown in FIG. 6.

Therefore, the second variable reactance circuit 18 operates as an equivalent reactance which is variable from zero to a negative given value in accordance with the electric current $I_0$ of the second variable current source 28.

Accordingly, in the reactance circuit shown in FIG. 3, the equivalent reactance as seen from the output terminal 10 can vary from a negative given value to a positive given value by changing the electric current flowing into the first and second variable current source 21 and 28, as already described in the above.

Two negative feedback loops are formed in the second variable reactance circuit 18 shown in FIG. 3, which is the same as the reactance circuit shown in FIG. 1. However, formed as well in the first variable reactance circuit 17 are two negative feedback loops without any positive feedback loop.

Thus, the first negative feedback loop of the first variable reactance circuit 17 is a loop which returns to the base of the first transistor 19 by way of the collector of the first transistor 19 and the first capacitor 25. The second negative feedback loop is a loop which returns to the base of the first transistor 19 by way of the emitter of the first transistor 19, the second transistor 20, the current mirror circuit 22 and the first capacitor 25. It is apparent that both loops will be the negative feedback and thus the stable operation in the circuit can be realized.

FOURTH EMBODIMENT

In this embodiment, the first coil 37 and the second coil 38 are used as the reactance element in substitution for the first capacitor 25 and the second capacitor 29, as shown in FIG. 4. It will be apparent that the output terminal 10 can produce the equivalent reactance which is variable from a negative given value to a positive given value.

Figure 8:
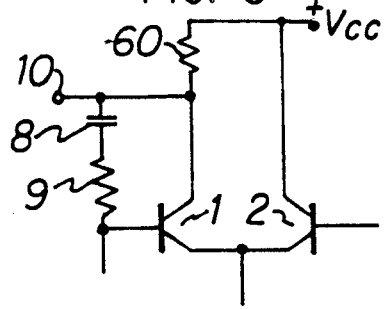
FIG. 8 is a block diagram of another embodiment similar to that of FIG. 2, except that a resistor replaces the current mirror circuit.

In the embodiments as set forth above, the current mirror circuit is used as a load of the differential amplification circuit, but it may be of course replaced by a resistor (see resistor 60 in FIG. 8).

APPLICATION TO ELECTRONIC EQUIPMENTS

FIG. 5 shows one example in a case where the variable reactance circuit according to the present invention is used in the oscillation circuit constituting a VCO (Voltage Control Oscillator) in the radio receiver or the like.

The oscillation circuit comprises first and second transistors 41, 42 differentially connected to each other, an oscillation element 43 such as crystal resonator or the like connected to the collector of the second transistor 42, and a variable reactance circuit 39 or the like. The variable reactance circuit 39 is selected from any one of the variable reactance circuits as shown in FIGS. 1 to 4.

In the aforesaid oscillation circuit, the equivalent reactance of the variable reactance circuit 39 is connected in parallel with the reactance of the oscillation element 43, and the resonance frequency of the oscillation circuit varies in accordance with the value of the equivalent reactance of the variable reactance circuit 39.

Specifically, in the case the reactance circuit as shown in FIG. 3 or FIG. 4 is used as the reactance circuit 39, the oscillation frequency of the oscillation circuit 40 can be varied up and down throughout a wide range around the oscillation frequency natural to the oscillation element 43.

Although the present invention has fully been described in connection with the preferred embodiments thereof with reference to the accompanying drawings, it is to be understood that various changes and modifications will be apparent to those skilled in the art without departing from the spirit or scope of the present invention.

What is claimed is:

1. A reactance circuit for preventing oscillation and spurious resonance from occurring, comprising:
   first and second transistors each having a base, a collector and an emitter, the emitters of the first and second transistors being connected to each other in common,
   a variable current source connected to the emitters of the first and second transistors,
   a load connected between the collectors of the first and second transistors and also to a power source, a feedback loop that includes the collector and the base of the first transistor, a capacitor and a resistor connected in series from the collector of the first transistor to the base of the first transistor;

another feedback loop which includes the second transistor, the load, the capacitor and the resistor all connected in series from the emitter of the first transistor to the base of the first transistor, a reactance element being connected between the base of the first transistor and a reference potential, and an output terminal connected to the collector of the first transistor.

2. The reactance circuit as defined in claim 1 wherein the reactance element is a capacitor.

3. The reactance circuit as defined in claim 1 wherein the reactance element is a coil.

4. The reactance circuit as defined in claim 1, wherein the load is a current mirror circuit, an input terminal of the current mirror circuit being connected to a collector of the second transistor, the current mirror circuit having an output terminal that is connected to the collector of the first transistor and having a power source terminal connected to the power source.

5. The reactance circuit as defined in claim 1, wherein the load is a resistor, the resistor having one terminal connected to the collector of the first transistor and the resistor having another terminal connected to the power source and also to a collector of the second transistor.

6. A reactance circuit for preventing oscillation and spurious resonance form occurring comprising:

a first variable reactance circuit for operating as a positive reactance, a second variable reactance circuit for operating as a negative reactance, the first and the second variable reactance circuits being connected to an output terminal in common, the first variable reactance circuit comprising first and second transistors each having an emitter, a collector and a base, a variable current source connected to the emitters of the first and the second transistors, and a first reactance element connected between the base and the collector of the first transistor, the emitters of the first and second transistors being connected to each other in common and to the variable current source, the second variable reactance circuit comprising third and fourth transistors each having an emitter, a collector and a base, a variable current source connected to the emitter of the third and the fourth transistors, a second reactance element connected between the base of the third transistor and a reference potential, and a capacitor and a resistor connected in series between the collector and the base of the third transistor, the emitters of the third and fourth transistors being connected to each other in common and to the variable current source, and a load connected to collectors of the first, second and fourth transistors and also to a power source, collectors of the first and third transistors being connected to the output in common to provide an output reactance, whereby the output reactance is variable from a negative value of reactance to a positive value of reactance dependent upon operation of said first and second reactance circuits.

7. The reactance circuit as defined in claim 6 wherein the first and the second reactance elements are coils.

8. The reactance circuit as defined in claim 6 wherein the first and the second reactance elements are capacitors.

* * * * *